(12) United States Patent
Gu et al.

(10) Patent No.: US 9,054,252 B1
(45) Date of Patent: Jun. 9, 2015

(54) TWO-AXIS TRACKING FRESNEL LENS SOLAR OVEN AND STOVE

(76) Inventors: Bingwu Gu, Elk Grove, CA (US); George Helmholz, Covelo, CA (US)

(*) Notice: Subject to any disclaimer, the term of this patent is extended or adjusted under 35 U.S.C. 154(b) by 814 days.

(21) Appl. No.: 13/333,841

(22) Filed: Dec. 21, 2011

Related U.S. Application Data

(60) Provisional application No. 61/431,234, filed on Jan. 10, 2011.

(51) Int. Cl.
| | | |
|---|---|---|
| *H01L 31/054* | (2014.01) |
| *F24J 2/38* | (2014.01) |
| *H01L 31/052* | (2014.01) |
| *H02S 10/10* | (2014.01) |

(52) U.S. Cl.
CPC ........ *H01L 31/0525* (2013.01); *H01L 31/0522* (2013.01); *H01L 31/0583* (2013.01)

(58) Field of Classification Search
CPC ............... F24J 2/00; F24J 2/0015; F24J 2/02; F24J 2/38; F24J 2/40; F24J 2/402; H01L 31/00; H01L 31/052; H01L 3/0522; H01L 3/0524; H01L 3/0525; H01L 3/058; H01L 3/0583
See application file for complete search history.

(56) References Cited

U.S. PATENT DOCUMENTS

2010/0275972 A1* 11/2010 Benitez et al. ................ 136/246

FOREIGN PATENT DOCUMENTS

RU  2292003  * 1/2007 ................ F24J 2/08

OTHER PUBLICATIONS

English machine translation of Abdullaev et al. (RU 2292003), published on Jan. 2007.*

* cited by examiner

*Primary Examiner* — Christina Chern
(74) *Attorney, Agent, or Firm* — Gerald R Prettyman

(57) ABSTRACT

A two-axis tracking solar concentrator system includes a sunlight concentrator, a Fresnel lens, a two-axis solar tracker, sunlight reflectors, an enclosure, a sunlight conversion device, and other components. The lens has very long focal length so that all concentrated sunlight will enter the sunlight conversion device through a small window. The elevation rotation axis goes through the focal point so that the sunlight conversion device will remain at the same horizontal level all the time. The concentrated sunlight makes it easy to achieve a needed temperature. The two-axis tracking design eliminates the need of frequent adjustment. An offset design permits having the sunlight conversion device under shade, so that people do not have to expose themselves to sunlight to do solar cooking. The enclosure significantly reduces the risk of burns and fires. It also makes it very easy to control the heating or cooking process.

24 Claims, 10 Drawing Sheets

$W \sim f = L + D$

TWO-AXIS TRACKING FRESNEL LENS SOLAR OVEN AND STOVE

CROSS-REFERENCE TO RELATED APPLICATIONS

This application claims benefit of priority of U.S. Provisional Patent Application 61/431,234 filed Jan. 10, 2011 and titled "TWO-AXIS TRACKING SOLAR OVEN AND STOVE," the disclosure of which is incorporated by reference. This application is related to co-pending U.S. patent application Ser. No. 13/333,854 titled "TWO-AXIS TRACKING PARABOLIC REFLECTOR SOLAR OVEN AND STOVE" filed Dec. 21, 2011.

BACKGROUND OF THE INVENTION

1. Field of Invention

This invention relates to the field of solar energy, more specifically, it relates to the direct use of solar radiation for cooking, heating, and other thermal applications.

2. Description of Related Art

As the world becomes more environmental conscious, there is a rising concern regarding deforestation, green house gas emission, and finding renewable energy to replace fossil fuels. Cooking is the major necessity for people all over the world. It accounts for a major share of energy consumption in developing countries. Cooking with the sun has long been presented as a potentially viable substitute for some of the fuels used in food preparation, water pasteurizing, space and other heating.

Solar cooking has been in use since 1650, though it is not popular even in developing countries. The use of solar cookers is far below its potential. One reason is that conventional solar oven/cookers are very difficult to use. Box-type solar cookers have trouble reaching cooking temperature, and lack controls of the cooking process. Concentrator type of solar cookers need frequent adjustment to track the sun. Long time standing nearby the concentrator in the sun also represents the risk of burns. A concentrator with its focal point in open space is also a hazard of fires.

SUMMARY OF THE INVENTION

Disclosed is a solar concentrator system (100) comprising:

a) a six-sided solar concentrator enclosure (101) having a Fresnel lens (102) with four edges (103-106), with at least two of the edges having an approximately equal width W (107), the Fresnel lens (102) having an optical center point OC located at an optical center length L (144) from the Fresnel lens (102) along an optical center line (138), an offset distance D between the optical center point OC and a focal point F (145) with a focal length f of the Fresnel lens (102) equal to L+D, with the Fresnel lens (102) oriented as to concentrate sunlight (108) passing through the Fresnel lens (102) into the six-sided solar concentrator enclosure (101);

b) a flat reflector side (109) in the shape of a trapezoid having a long parallel edge (103) attached to the Fresnel lens (102), with a short parallel edge (110) attached to a base side (128), with a first converging edge (111) and a second converging edge (112) equal in measurement and attached to the Fresnel lens (102) at the long parallel edge (103) and terminating at the short parallel edge (110), with the flat reflector side (109) having a flat reflector face (113) oriented at an angle (θ) to receive concentrated but unfocused sunlight (108) passing though the Fresnel lens and to reflect the sunlight (108) towards a sunlight window side (114), with the short parallel edge (110) smaller in measurement than the long parallel edge (103) and equal in measurement to an adjacent edge of the base side (128);

c) a sunlight window side (114) facing the flat reflector side (109), the sunlight window side (114) in the shape of a trapezoid having a long parallel edge (104) attached to the Fresnel lens (102), with a short parallel edge (115) attached to the base side (128), with a first converging edge (116) and a second converging edge (117) equal in measurement and attached to the Fresnel lens (102) at the long parallel edge (104) and terminating at the short parallel edge (115), with the sunlight window side (114) oriented at an angle of approximately 90-degrees to the Fresnel lens (102), with the sunlight window side (114) having a sunlight window (118) with a center (119) of a diameter (120), with the center (119) of the diameter (120) located along an optical center line (138) such that reflected sunlight from the flat reflector side (109) passes through the sunlight window (118) to the focal point F (146) of the Fresnel lens (102), with the short parallel edge (115) smaller in measurement than the long parallel edge (104) and equal in measurement to an adjacent edge of the base side (128);

d) a first reflector side (122) and a second reflector side (123) in the shape of a trapezoid, the first reflector side (122) and the second reflector side (123) comprising opposite sides of the six-sided solar concentrator enclosure (101), with the first reflector side (122) and the second reflector side (123) connected between the flat reflector side (109) and the sunlight window side (114), with the first reflector side (122) having a long parallel edge (105) attached to the Fresnel lens (102) and a short parallel edge (124) attached to the base side (128), with the second reflector side (123) having a long parallel edge (105) attached to the Fresnel lens (102) and a short parallel edge (125) attached to the base side (128), with the first reflector side (122) having a first converging edge (111) and a second converging edge (116) attached to the Fresnel lens (102) at the long parallel edge (106) and terminating at the short parallel edge (124), with the second reflector side (123) having a first converging edge (112) and a second converging edge (117) attached to the Fresnel lens (102) at the long parallel edge (105) and terminating at the short parallel edge (125), with the first reflector side (122) having a flat reflector face (126) oriented towards the second reflector side (123) and the second reflector side (123) having a flat reflector face (127) oriented towards the first reflector side (122), and the short parallel edges (124, 125) of the first reflector side (122) and the second reflector side (123) equal in measurement to and attached to opposite edges of the base side (128);

e) a base side (128) with a first base edge (110) attached to the short parallel edge of the flat reflector side (109), a second base edge (115) attached to the short parallel edge of the sunlight window side (114), a third base edge (124) attached to the short parallel edge of the first reflector side (122) and a fourth base edge (125) attached to the short parallel edge of the second reflector side (123), with a reflector inner face (129) facing towards the Fresnel lens and a base outer face (130) facing away from the six-sided solar concentrator enclosure (101);

f) an elevation tracking rotation axis frame (135) attached to the six-sided solar concentrator enclosure (101) having a elevation tracking rotation pin (136) with a center (137) that is aligned on an optical center line (138) that is aligned with the optical center length L (144) of the Fresnel lens (102), the center (119) of the diameter (120) of the sunlight window (118), and with the focal point (145) of the Fresnel lens (102);

g) an azimuth tracking rotation axis frame (140) rotationally attached to the elevation tracking rotation axis frame (135), the azimuth tracking rotation axis frame (140) having a azimuth tracking rotation pin (141) located near the base outer face (130) of the base side (128), such that the elevation tracking rotation axis frame (135) and six-sided solar concentrator enclosure (101) may rotate independent of the azimuth tracking rotation axis frame (140) to track the sunlight (108); and h) a sunlight conversion device (142) attached to the azimuth tracking rotation axis frame (140), and having a sunlight aperture (133) for receiving concentrated sunlight from the six-sided solar concentrator enclosure (101) at the focal point F of the fresnel lens (102).

In some embodiments, the width W (107) of the at least two of the edges of the Fresnel lens (102) is approximately equal to the focal length f of the Fresnel lens (102).

In some embodiments, the angle (θ) of the flat reflector face (113) of the flat reflector side (109) is approximately 45-degrees to the Fresnel lens (102).

In some embodiments, the sunlight window side (114) is attached at approximately a 90-degree angle to the Fresnel lens (102).

In some embodiments, the flat reflector face (113) of the flat reflector side (109) is angularly optimized to reflect sunlight passing through the Fresnel lens (102) at 90 degrees into the sunlight window (118).

In some embodiments, the solar concentrator system (100) may further comprise an azimuth tracking drive, an elevation tracking drive, or both.

In some embodiments, the solar concentrator system (100) may further comprise a loss reduction tube (131) rotationally positioned at the sunlight window (118) for transmitting sunlight from the six-sided solar concentrator enclosure (101) to a sunlight conversion device.

In some embodiments, the sunlight conversion device (142) may be an oven, a stove, a water distiller, a food dehydrator, a circulating heat system, a BBQ smoker, clothes dryer, an absorption refrigerator, or a thermal engine.

In some embodiments, the sunlight conversion device (142) may be a photovoltaic panel.

In some embodiments, the solar concentrator system (100) may further comprise a cover over the six-sided solar concentrator system (101) for adjusting the quantity of sunlight entering the six-sided solar concentrator system (101), a sunlight blocking device for adjusting the quantity of sunlight entering the sunlight conversion device (142), at least one reflective inner side (143) in the sunlight conversion device (142), at least one absorptive inner side (143) in the sunlight conversion device (142) or a thermal switch in the sunlight conversion device.

A method for converting sunlight to heat or electricity comprising a) receiving sunlight into a solar concentrator enclosure through a fresnel lens having an optical center length and a focal point at a distance longer than the optical center length; b) reflecting the sunlight within the solar concentrator enclosure at a distance from the fresnel lens approximate to the optical center length of the fresnel lens; c) passing the sunlight through an sunlight window aperture of the solar concentrator enclosure to the focal point of the fresnel lens, and d) converting the sunlight into heat or electricity in a sunlight conversion device that is not moving in an elevation direction.

DETAILED DESCRIPTION

Embodiments are directed to systems and methods for converting sunlight to heat food, other materials or to make electricity in a sunlight conversion device that is not moving in an elevation direction.

Figure 1:
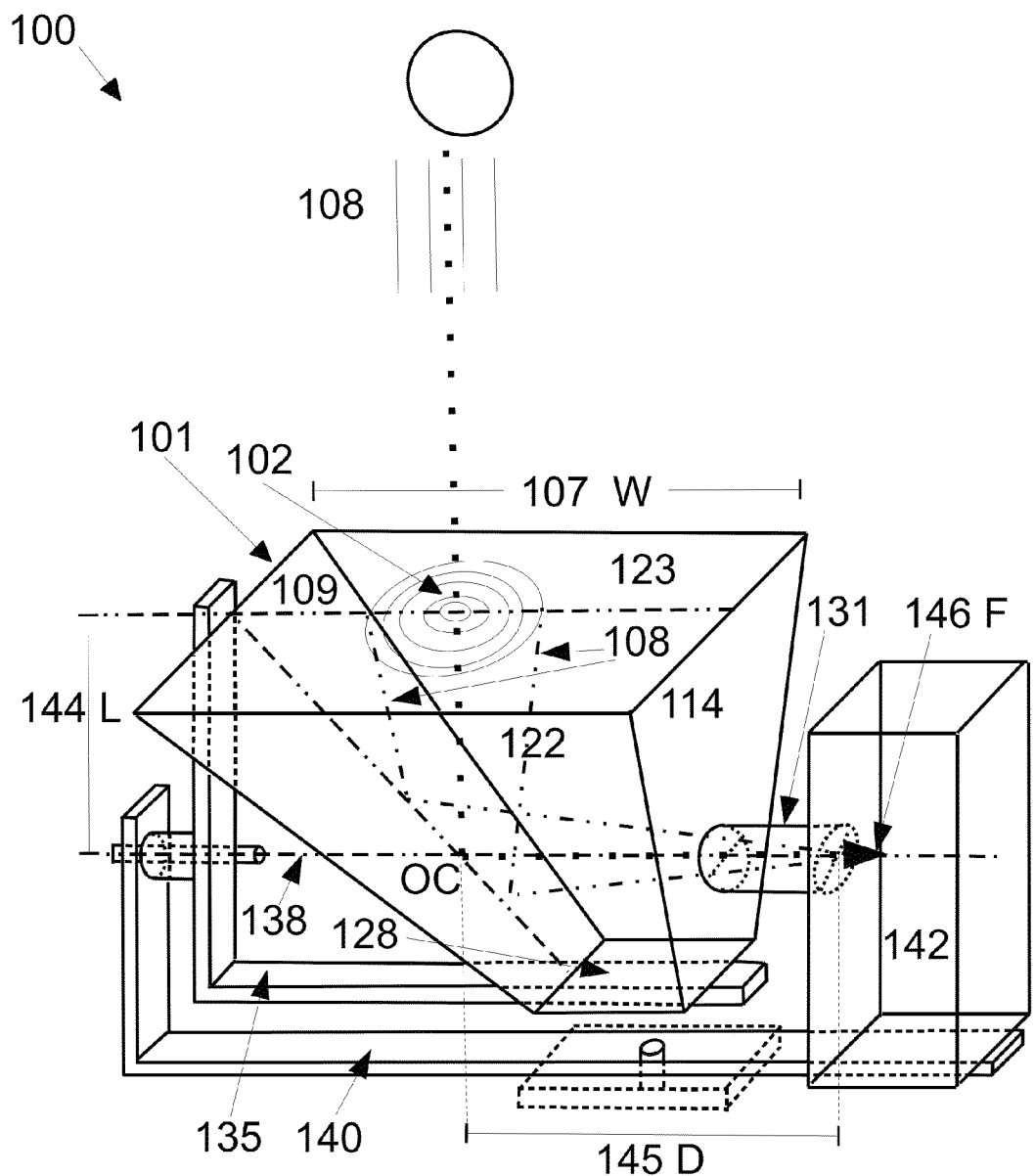
FIG. 1 shows the solar concentrator system (100) with its six-sided solar concentrator enclosure (101) and an exemplary sunlight conversion device (142).

FIG. 1 shows the solar concentrator system (100) with its six-sided solar concentrator enclosure (101) and an exemplary sunlight conversion device (142). Shown in FIG. 1 are the solar concentrator system (100), a six-sided solar concentrator enclosure (101), sunlight (108), a Fresnel lens (102), an edge width W (107) of the Fresnel lens, an optical center point OC of the Fresnel lens, a flat reflector side (109), a sunlight window side (114), a first reflector side (122), a second reflector side (123), a base side (128), an optional loss reduction tube (131), an elevation tracking rotation axis frame (135), an optical center line (138), an azimuth tracking rotation axis frame (140), a sunlight conversion device (142), an optical center length L (144) of the Fresnel lens (102), an offset distance D (145) and a focal point F (146) of the Fresnel lens (102).

Of the features as shown in FIG. 1, the solar concentrator system (100) comprises a six-sided solar concentrator enclosure (101) and a sunlight conversion device (142). The six-sided solar concentrator enclosure (101) comprises six sides. These sides are a Fresnel lens (102), a flat reflector side (109), a sunlight window side (114), a first reflector side (122), a second reflector side (123) and a base side (128). The Fresnel lens has at least two edges with width W (107).

Hinges may be used to connect the Fresnel lens (102) and the other sides of the six-sided solar concentrator enclosure (101). When the solar concentrator system is not in use, the Fresnel lens (102), and the six-sided solar concentrator enclosure (101) can be folded into a small package. It becomes a portable folding system for easy storage and travel.

Optically attached to the six-sided solar concentrator enclosure (101) is a sunlight conversion device (142). In some embodiment, the sunlight conversion device is an oven. In some embodiments, the sunlight conversion device is a stove. In some embodiments an optional loss reduction tube (131) may be between the six-sided solar concentrator enclosure (101) and the sunlight conversion device (142).

Also attached to the six-sided solar concentrator enclosure (101) is an elevation tracking rotation axis frame (135). Rotationally affixed to the elevation tracking rotation axis frame (135) is an azimuth tracking rotation axis frame (140), to which is affixed the sunlight conversion device (142). Each of these features is shown and explained in further detail through the other Figures.

Also shown in FIG. 1, and associated with the Fresnel lens (102), is an optical center point OC, which is the intersection point of the optical center line (138) of the Fresnel lens (102) and the flat reflector side (109) of the solar concentrator enclosure (101). The optical center point QC is located a distance shown as optical center length L (144) from the Fresnel lens (102). Passing though this point is an optical center line (138) along which is a focal point F (146) of the Fresnel lens (102). The focal point F (146) is located from the optical center point OC a distance shown as an offset distance D (145). The focal length f of the Fresnel lens is cumulatively an optical distance equal to the optical center length L (144) plus the offset distance D (145), i.e., f=L+D.

As shown by FIG. 1, sunlight (108) passes through the Fresnel lens (102) and converges towards the optical center point OC. As the optical center point OC is at a distance L (144) less than the focal length f, the six-sided solar concentrator enclosure (101) redirects the sunlight to the focal point F (146), which is outside the six-sided solar concentrator enclosure (101). This configuration of the solar concentrator system (100) delivers focused sunlight to the focal point F (146) located inside a sunlight conversion device (142). This configuration optimizes the delivered energy.

Figure 2:
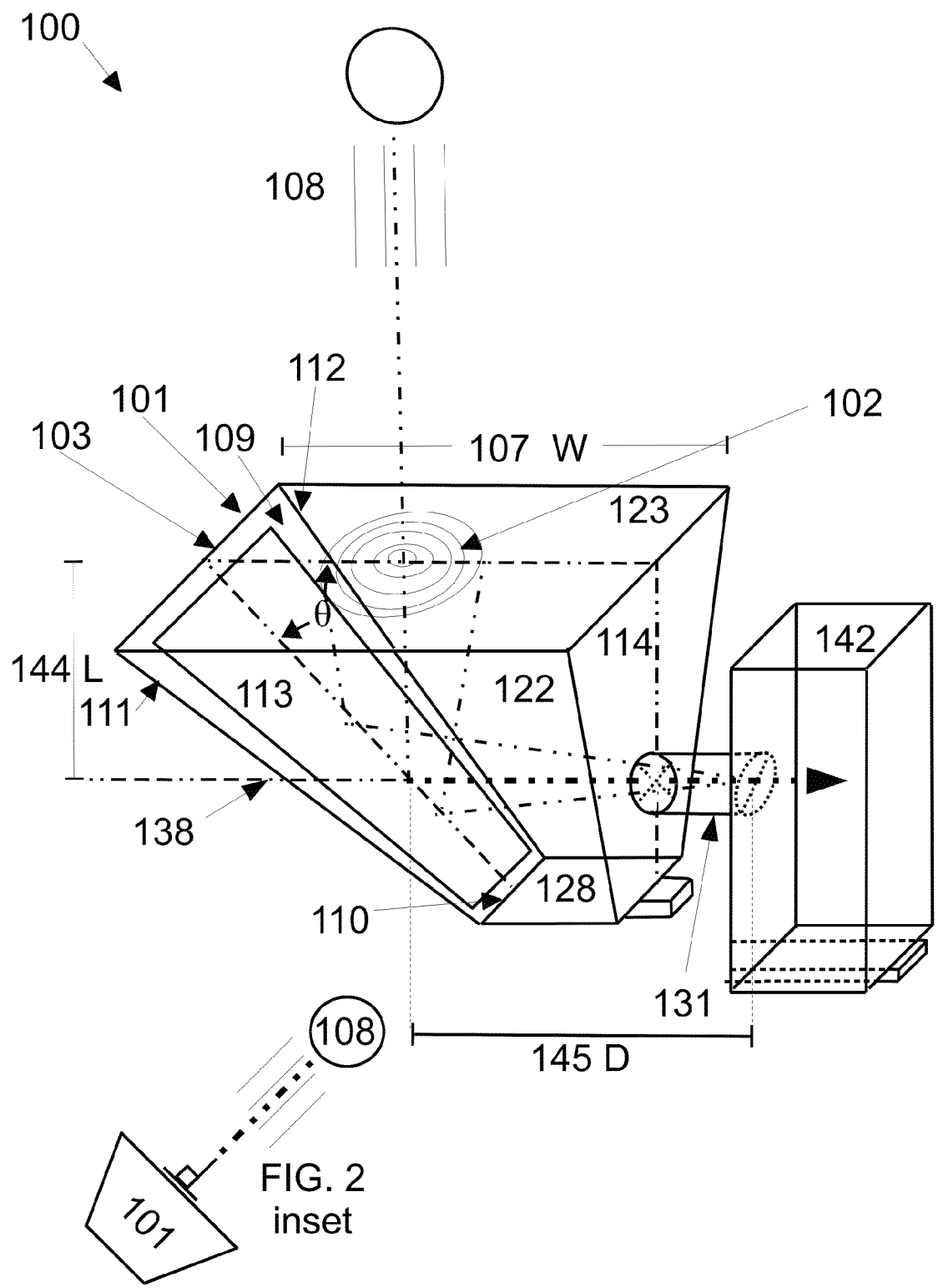
FIG. 2 is a partial drawing of the solar concentrator system (100) with its six-sided solar concentrator enclosure (101) showing the flat reflector side (109).

FIG. 2 is a partial drawing showing the solar concentrator system (100) with its six-sided solar concentrator enclosure (101) showing the flat reflector side (109).

Of the features as shown in FIG. 2 are the solar concentrator system (100), the six-sided solar concentrator enclosure (101), the Fresnel lens (102) with a Fresnel lens edge width W (107), a flat reflector side long parallel edge (103), sunlight (108), a flat reflector side (109), a flat reflector side short parallel edge (110), a flat reflector side first converging edge (111), a flat reflector side second converging edge (112), a flat reflector face (113), a first reflector side (122), a sunlight window side (114), a second reflector side (123), the base side (128), an Fresnel lens optical center length L (144), an offset distance D (145), and an angle theta (θ) of the flat reflector face (113) with the Fresnel lens (102).

The flat reflector side (109) is in the shape of a trapezoid having a long parallel edge (103), which is attached to the Fresnel lens (102). The measurement of the long parallel edge (103) is equal in measurement to the attached edge of the Fresnel lens (102), which is equal in measurement to the Fresnel lens edge width W (107). The measurement of the Fresnel lens (102) edge width W (107) is generally the same or shorter than the Fresnel lens focal length (discussed below).

The flat reflector side (109) has a short parallel edge (110) that is parallel to the long parallel edge (103) and is attached to a base side (128). The base side (128) is opposite the Fresnel lens (102) in the six-sided solar concentrator enclosure (101). The length of the short parallel edge (110) is the same as the attached edge of the base side (128).

The flat reflector side (109) has a first converging edge (111) and a second converging edge (112), which are equal in measurement and are attached to the Fresnel lens (102) at the long parallel edge (103) and terminate at the short parallel edge (110).

The term "converging" in reference to the first converging edge (111) and the second converging edge (112) refers to the concept that as the flat reflector side (109) is a trapezoid, there are two parallel edges (103 and 110) and two non-parallel edges (111 and 112) and that as the flat reflector side (109) is a planar body, the two non-parallel edges (111 and 112) are converging towards the short parallel edge (110), and diverging towards the long parallel edge (103). In this configuration, the measurement (length) of the short parallel edge (110) is less than the measurement (length) of the long parallel edge (103).

The flat reflector side (109) has a flat reflector face (113) oriented at an angle (θ) of approximately 45 degrees to the Fresnel lens (102). This orientation reflects sunlight (108) passing though the Fresnel lens (102) at 90 degrees to a sunlight window side (114). The flat reflector face (113) may comprise any portion of the flat reflector side (109) from a minor fraction up to and including the entire surface of the flat reflector side (109).

The angle theta (θ) of the flat reflector side (109) to the Fresnel lens (102) is dependent on the characteristics of the Fresnel lens (102) and to the angle of the six-sided solar concentrator enclosure (101) towards the sunlight (108) for reflecting sunlight (108) into the sunlight conversion device (142) but should be approximately 45-degrees when the Fresnel lens (102) is generally planar perpendicular towards the sun as shown in the FIG. 2 inset.

Attached to the flat reflector side (109) at the first converging edge (111) is a first reflector side (122). Attached to the flat reflector side (109) at the second converging edge (112) is a second reflector side (123).

With regard to the optical properties of the Fresnel lens, the optical center distance is approximately equal to the distance between the Fresnel lens (102) and the optical center line (138). Line L (144) represents this distance. The focal length f of the Fresnel lens is equal to the sum of L+D, i.e., the distance L (144) to the optical center, and the offset distance D (145).

Figure 3:
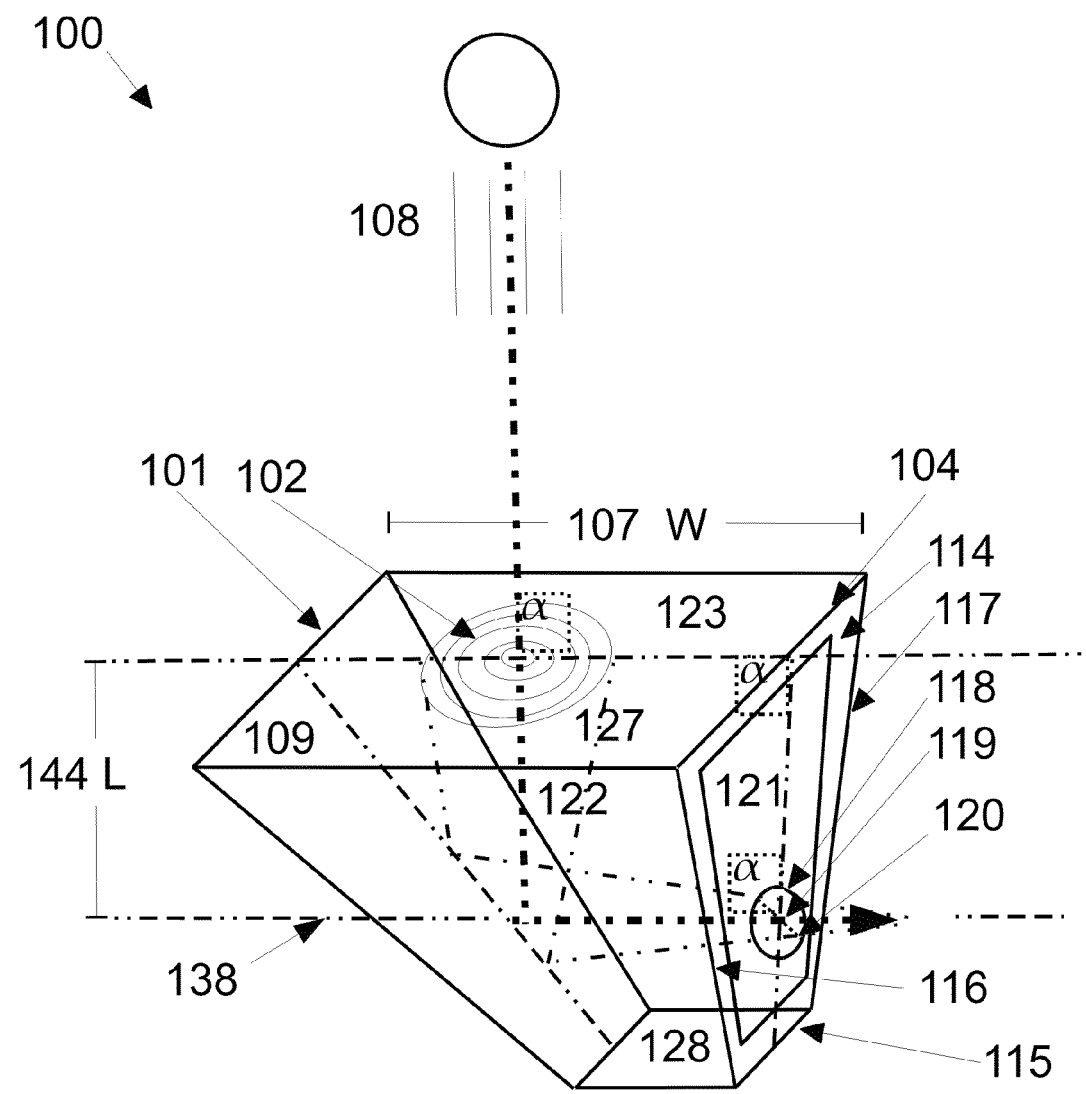
FIG. 3 is a partial drawing of the solar concentrator system (100) with its six-sided solar concentrator enclosure (101) showing the sunlight window side (114).

FIG. 3 is a partial drawing of the solar concentrator system (100) with its six-sided solar concentrator enclosure (101) showing the sunlight window side (114).

Of the features as shown in FIG. 3 are the solar concentrator system (100), the six-sided solar concentrator enclosure (101), the Fresnel lens (102) with a Fresnel lens edge width W (107) and a optical center length L (144), a sunlight window side (114), a sunlight window side long parallel edge (104), sunlight (108), a sunlight window side short parallel edge (115), a sunlight window side first converging edge (116), a sunlight window side second converging edge (117), a sunlight window (118) with a center (119) and a diameter (120), a flat reflector face (121), the flat reflector side (109), the first reflector side (122), the second reflector side (123), the base side (128), an angle alpha (α) of the flat reflector face (113) with the Fresnel lens (102) and an angle alpha (α) of the sunlight window side (114) with the Fresnel lens (102).

The sunlight window side (114) is opposite of the flat reflector side (109) in the solar concentrator enclosure (101).

The sunlight window side (114) in the shape of a trapezoid having a long parallel edge (104), which is attached to the Fresnel lens (102). The measurement of the long parallel edge (104) is equal in measurement to the attached edge of the Fresnel lens (102), which is equal in measurement to the Fresnel lens edge width W (107).

The sunlight window side (114) has a short parallel edge (115) that is parallel to the long parallel edge (104) and is attached to a base side (128). The base side (128) is opposite the Fresnel lens (102) in the six-sided solar concentrator enclosure (101). The measurement of the short parallel edge (115) is the same as the attached edge of the base side (128).

The sunlight window side (114) has a first converging edge (116) and a second converging edge (117), which are equal in measurement and are attached to the Fresnel lens (102) at the long parallel edge (104) and terminate at the short parallel edge (115). The term "converging" is explained above.

The sunlight window side (114) has a flat reflector face (121) oriented at angle alpha (a) to the Fresnel lens (102). This orientation is to reflect sunlight that does not enter the sunlight window (118) towards and off another side, such as the flat reflector side (109), the first reflector side (122), the second reflector side (123) or the base side (128), and then into the sunlight window (118). The flat reflector face (121) may comprise any portion of the sunlight window side (114) from a minor fraction up to and including the entire surface of the sunlight window side (114).

As indicated by the right angle symbols, the sunlight window side (114) is generally positioned in the six-sided solar concentrator enclosure (101) so that the sunlight window side (114) is close to a 90-degree (right) angle (alpha, a) to the focal line (138) and to the Fresnel lens (102), which should be perpendicular to the incoming sunlight (108).

Located on the sunlight window side (114) is a sunlight window (118). The sunlight window (118) has a center (119) and a diameter (120). The center (119) of the diameter (120) of the sunlight window (118) is located along the optical center line (138). The sunlight window (118) is relatively small to limit heat loss.

This measurement L (144) is the optical center length of the Fresnel lens (102). The focal length f of the Fresnel lens (102) is approximately equal to the Fresnel lens (102) edge width W (107). The principle of placing the center (119) of the diameter (120) of the sunlight window (118) at the focal point of the Fresnel lens (102) and on optical center line (138) is so that sunlight (108) concentrated by the Fresnel lens (102) strikes the angularly optimized flat reflector face (113) of the flat reflector side (109) and is further concentrated into the sunlight window (118), and then into the sunlight conversion device which is not moving in the elevation direction.

The measurement of the Fresnel lens (102) edge width W (107) is generally the Fresnel lens focal length f. The focal length f of the Fresnel lens (102) needs to be long enough so that all sunlight (108) can be convergent after going through the sunlight window (118) to the sunlight conversion device (142) (as shown on other Figures). This significantly increases the sunlight converting ability of the sunlight conversion device (142).

Attached to the sunlight window side (114) at the first converging edge (116) is a first reflector side (122). Attached to the sunlight window side (114) at the second converging edge (117) is a second reflector side (123).

Figure 4:
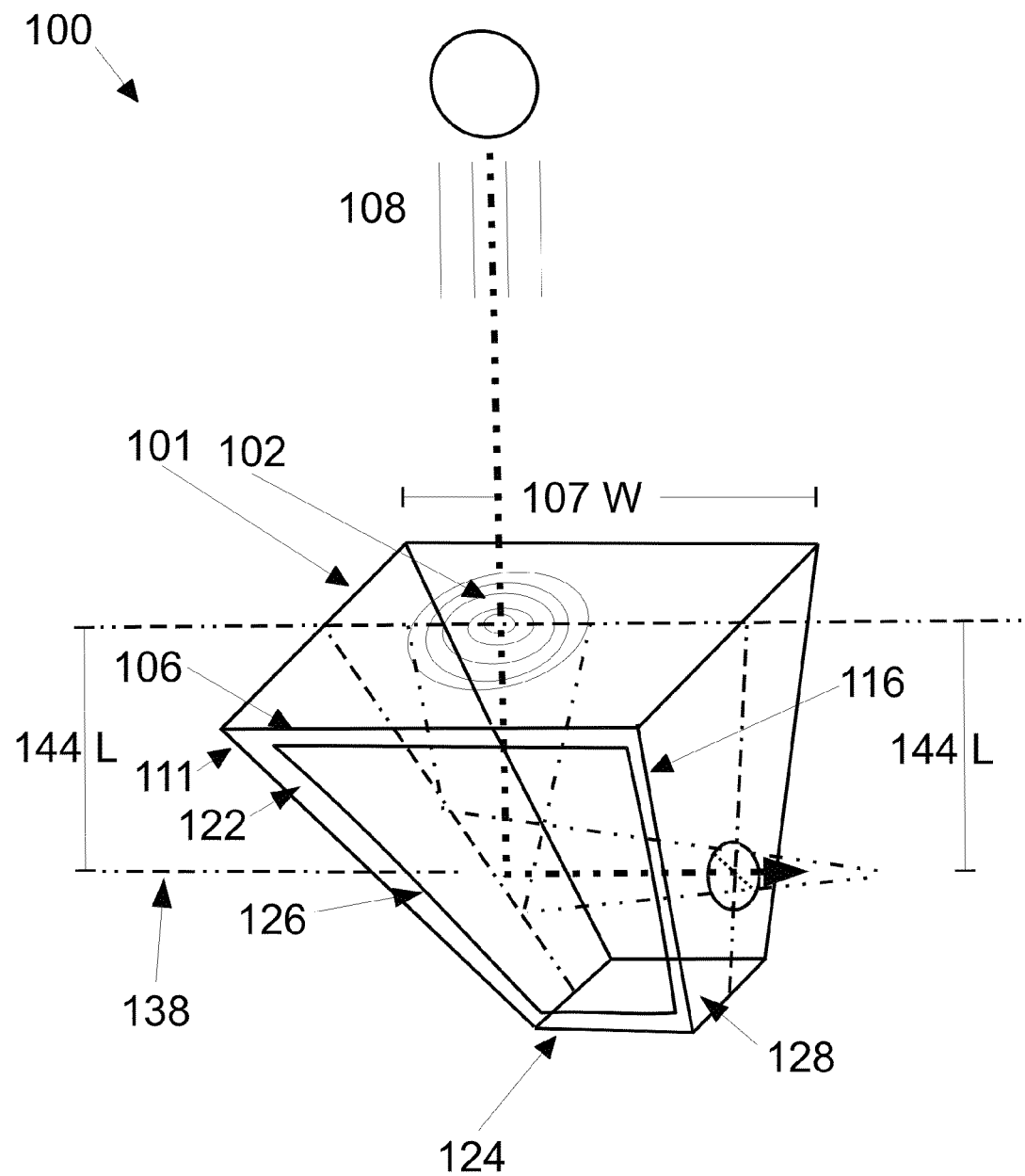
FIG. 4 is a partial drawing of the solar concentrator system (100) with its six-sided solar concentrator enclosure (101) showing the first reflector side (122).

FIG. 4 is a partial drawing of the solar concentrator system (100) with its six-sided solar concentrator enclosure (101) showing the first reflector side (122).

Of the features as shown in FIG. 4 are the solar concentrator system (100), the six-sided solar concentrator enclosure (101), the Fresnel lens (102) with a Fresnel lens edge width W (107) and a optical center length L (144), a first reflector side (122), a first reflector side long parallel edge (106), sunlight (108), a first reflector side short parallel edge (124), a first reflector side first converging edge (111), a first reflector side second converging edge (116), a flat reflector face (126), a distance L (144) from the Fresnel lens (102), the flat reflector side (109), the second reflector side (123), and the base side (128).

The first reflector side (122) is between the flat reflector side (109) and the sunlight window side (114).

The first reflector side (122) is in the shape of a trapezoid having a long parallel edge (106), which is attached to the Fresnel lens (102). The measurement of the long parallel edge (106) is equal in measurement to the attached edge of the Fresnel lens (102), which is equal in measurement to the Fresnel lens edge width W (107).

The first reflector side (122) has a short parallel edge (124) that is parallel to the long parallel edge (106) and is attached to a base side (128). The base side (128) is opposite the Fresnel lens (102) in the six-sided solar concentrator enclosure (101). The length of the short parallel edge (124) is the same as the attached edge of the base side (128).

The first reflector side (122) has a first converging edge (111) and a second converging edge (116), which are equal in measurement and are attached to the Fresnel lens (102) at the long parallel edge (106) and terminate at the short parallel edge (124). The term "converging" is explained above.

The first reflector side (122) has a flat reflector face (126). The flat reflector face (126) may be oriented at an angle of less than 90 degrees to the Fresnel lens (102). The flat reflector face (126) may comprise any portion of the first reflector side (122) from a minor fraction up to and including the entire surface of the first reflector side (122).

This orientation of the first reflector side (122) and the flat reflector face (126) is to reflect sunlight (108) passing though the Fresnel lens (102) towards and off another side, such as the flat reflector side (109), the sunlight window side (114), the second reflector side (123) or the base side (128), and into the sunlight window (118).

Attached to the first reflector side (122) at the first converging edge (111) is the flat reflector side (109). Attached to the first reflector side (122) at the second converging edge (112) is the sunlight window side (114). The size and orientation of the first reflector side (122) and the second reflector side (123) are mirror images of each other.

Figure 5:
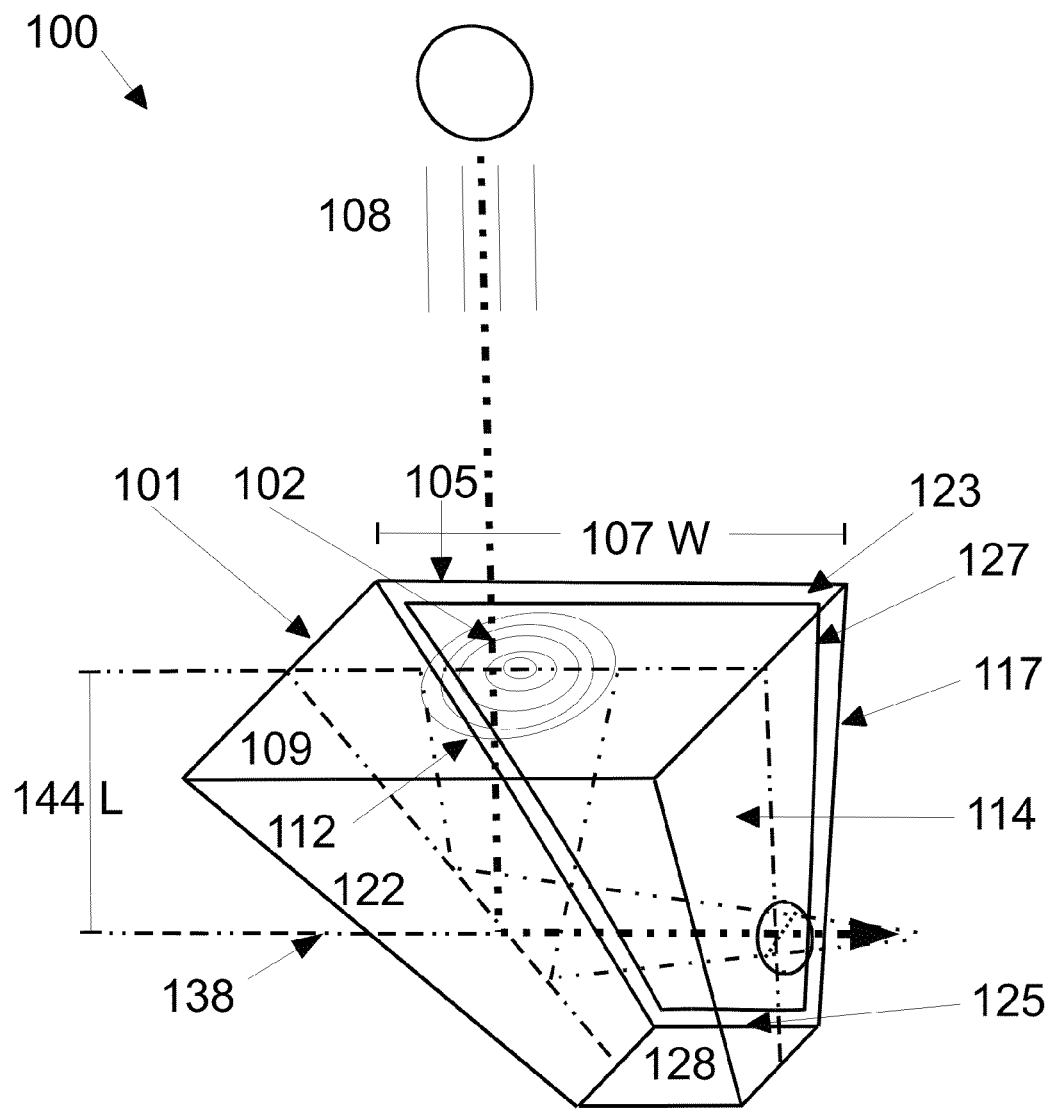
FIG. 5 is a partial drawing of the solar concentrator system (100) with its six-sided solar concentrator enclosure (101) showing the second reflector side (123).

FIG. 5 is a partial drawing of the solar concentrator system (100) with its six-sided solar concentrator enclosure (101) showing the second reflector side (123).

Of the features as shown in FIG. 5 are the solar concentrator system (100), the six-sided solar concentrator enclosure (101), the Fresnel lens (102) with a Fresnel lens edge width W (107) and a optical center length L (144), a second reflector side (122), a second reflector side long parallel edge (105), sunlight (108), a second reflector side short parallel edge (125), a second reflector side first converging edge (112), a second reflector side second converging edge (117), a flat reflector face (127), the flat reflector side (109), the first reflector side (122), and the base side (128).

The second reflector side (123) is between the flat reflector side (109) and the sunlight window side (114) and is opposite the first reflector side (122) in the six-sided solar concentrator enclosure (101).

The second reflector side (122) is in the shape of a trapezoid having a long parallel edge (105), which is attached to the Fresnel lens (102). The measurement of the long parallel edge (105) is equal in measurement to the attached edge of the Fresnel lens (102), which is equal in measurement to the Fresnel lens edge width W (107).

The second reflector side (127) has a short parallel edge (125) that is parallel to the long parallel edge (105) and is attached to a base side (128). The base side (128) is opposite the Fresnel lens (102) in the six-sided solar concentrator enclosure (101). The length of the short parallel edge (125) is the same as the attached edge of the base side (128).

The second reflector side (123) has a first converging edge (112) and a second converging edge (117), which are equal in measurement and are attached to the Fresnel lens (102) at the long parallel edge (105) and terminate at the short parallel edge (125). The term "converging" is explained above.

The second reflector side (123) has a flat reflector face (127). The flat reflector face (127) may be oriented at an angle of less than 90 degrees to the Fresnel lens (102). The flat reflector face (127) may comprise any portion of the first reflector side (123) from a minor fraction up to and including the entire surface of the first reflector side (123).

This orientation of the first reflector side (123) and the flat reflector face (127) is to reflect sunlight (108) passing though the Fresnel lens (102) towards and off another side, such as the flat reflector side (109), the sunlight window side (114), the first reflector side (122) or the base side (128), and into the sunlight window (118).

Attached to the second reflector side (123) at the first converging edge (112) is the flat reflector side (109). Attached to the second reflector side (123) at the second converging edge (117) is the sunlight window side (114). The size and orientation of the first reflector side (122) and the second reflector side (123) are mirror images of each other.

Figure 6:
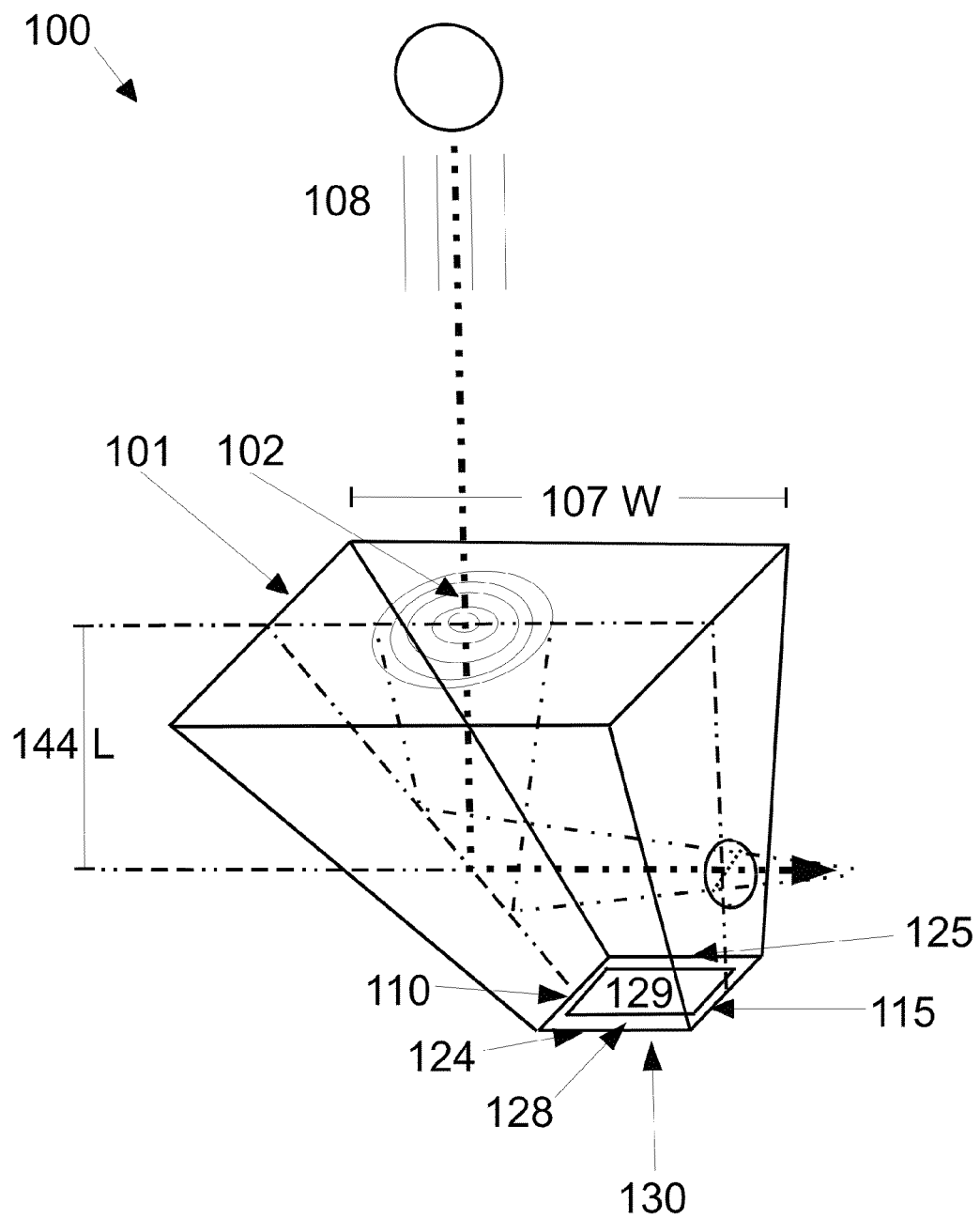
FIG. 6 is a partial drawing of the solar concentrator system (100) with its six-sided solar concentrator enclosure (101) showing the base side (128).

FIG. 6 is a partial drawing of the solar concentrator system (100) with its six-sided solar concentrator enclosure (101) showing the base side (128).

Of the features as shown in FIG. 6 are the solar concentrator system (100), the six-sided solar concentrator enclosure (101), the Fresnel lens (102) with a Fresnel lens edge width W (107) and a optical center length L (144), sunlight (108), a flat reflector side short parallel edge (110), a sunlight window side short parallel edge (115), a first reflector side short parallel edge (124), a second reflector side short parallel edge (125), a base side reflector inner face (129), and a base side outer face (130).

The base side (128) is opposite the Fresnel lens (102) in the six-sided solar concentrator enclosure (101).

The base side (128) is essentially rectangular. The measurement of the flat reflector side short parallel edge (110) is approximately equal to that of the sunlight window side short parallel edge (115). The measurement of the first reflector side short parallel edge (124) is approximately equal to that of the second reflector side short parallel edge (125).

The base side (128) has a base side reflector inner face (129). This orientation of the base side (128) and the base side reflector inner face (129) is to reflect sunlight (108) passing though the Fresnel lens (102) towards and off another side, such as the flat reflector side (109), the sunlight window side (114), the first reflector side (122) or the second reflector side (123), and into the sunlight window (118).

The base side (128) has a base side outer face (130). The base side outer face (130) forms an outer face of the six-sided solar concentrator enclosure (101) to affix the six-sided solar concentrator enclosure (101) to the framing and control systems.

Figure 7:
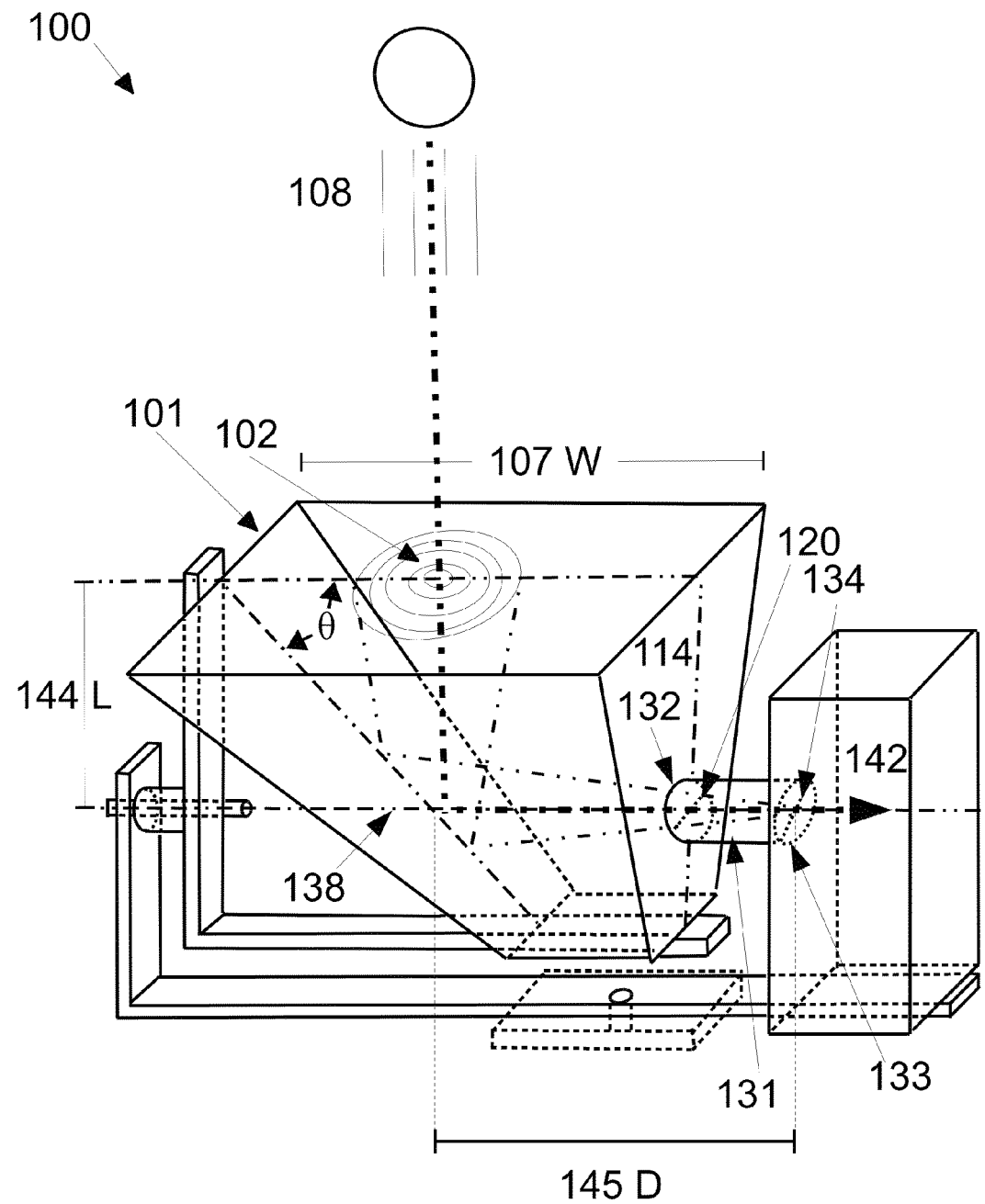
FIG. 7 is a partial drawing of the solar concentrator system (100) with its six-sided solar concentrator enclosure (101) showing the loss reduction tube (131) and an exemplary sunlight conversion device (142).

FIG. 7 is a partial drawing of the solar concentrator system (100) with its six-sided solar concentrator enclosure (101) showing the loss reduction tube (131) and an exemplary sunlight conversion device (142).

Of the features as shown in FIG. 7 are the solar concentrator system (100), the six-sided solar concentrator enclosure (101), the Fresnel lens (102) with a Fresnel lens edge width W (107) and a optical center length L (144), sunlight (108), the sunlight window side (114), a sunlight window (118) with a center (119), the sunlight window diameter (120), a loss reduction tube (131), a loss reduction tube first end (132), a sunlight aperture (133) of the sunlight conversion device, a sunlight aperture diameter (134), the optical center line (138), and the sunlight conversion device (142).

Rotationally positioned between the six-sided solar concentrator enclosure (101) and the sunlight conversion device (142) is an optional loss reduction tube (131) The loss reduction tube (131) has a loss reduction tube first end (132) that coincides with the sunlight window (118) on the sunlight window side (114). As they coincide, they share the same center (119), and sunlight window diameter (120). The loss reduction tube (131) may be attached to the six-sided solar concentrator enclosure (101) or may be rotationally positioned at the sunlight window (118).

The center (119) of the sunlight window (118) is aligned along the optical center line (138) along with the loss reduction tube (131). The interior of the loss reduction tube (131) is generally reflective to transmit sunlight (108) from the six-sided solar concentrator enclosure (101) into the sunlight conversion device (142). At the sunlight conversion device (142) end of the loss reduction tube (131) is the sunlight aperture (133). The sunlight aperture (133) has a diameter (134). To optimize sunlight transmission, the measurement of the sunlight aperture diameter (134) is about the same measurement as the sunlight window diameter (120).

Sunlight (108) concentrated by the six-sided solar concentrator enclosure (101) exits the loss reduction tube (131) at the sunlight aperture (133) into the sunlight conversion device (142).

Figure 8:
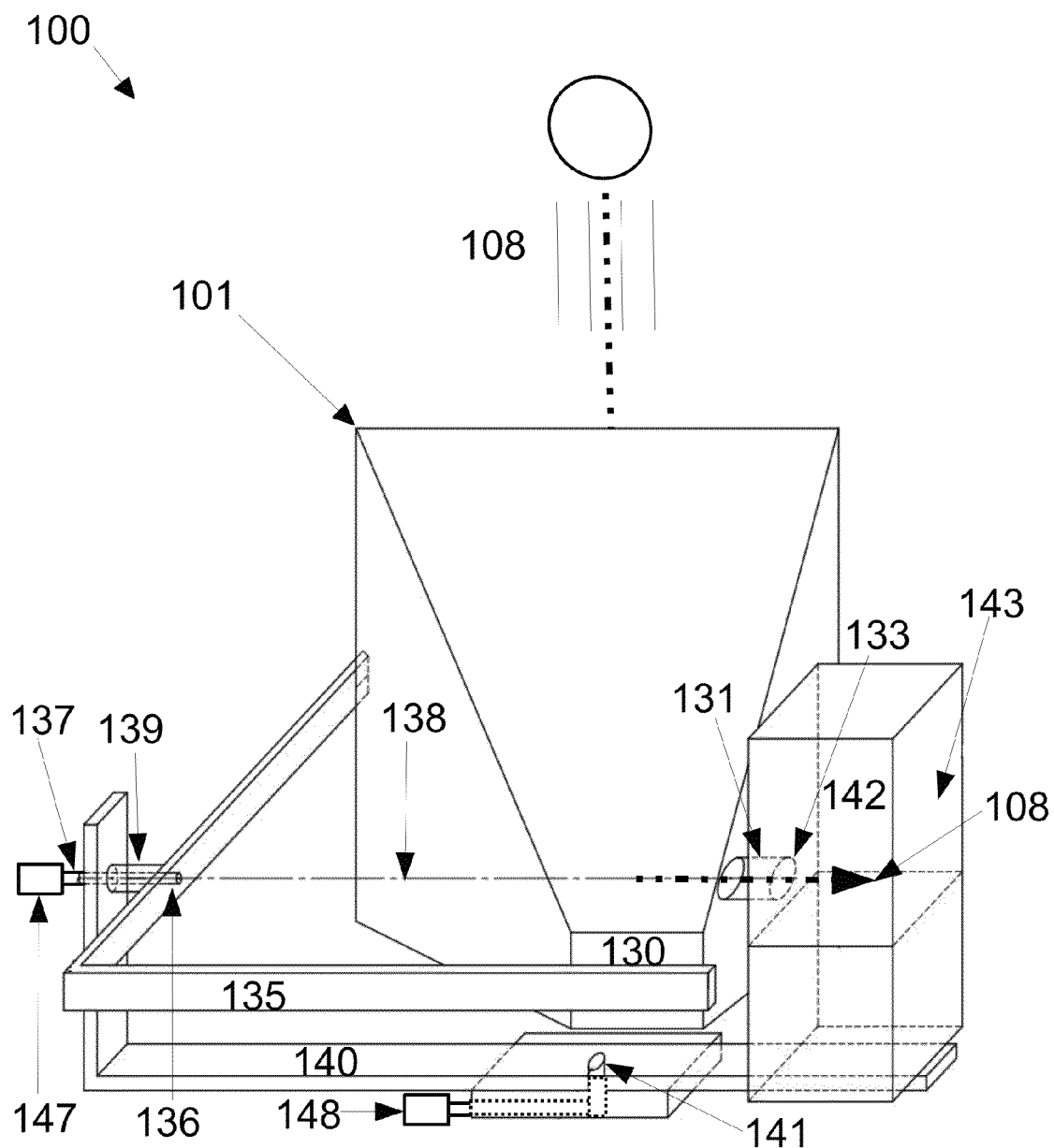
FIG. 8 is a partial drawing of the solar concentrator system (100) with its six-sided solar concentrator enclosure (101) and the exemplary sunlight conversion device (142) showing the elevation tracking rotation axis frame (135) and the azimuth tracking rotation axis frame (140) for aligning the solar concentrator system (100) with the sun (108).

FIG. 8 is a partial drawing of the solar concentrator system (100) with its six-sided solar concentrator enclosure (101) and the exemplary sunlight conversion device (142) showing the elevation tracking rotation axis frame (135) and the azimuth tracking rotation axis frame (140) for aligning the solar concentrator system (100) with the sun (108).

Of the features as shown in FIG. 8 are the solar concentrator system (100), the six-sided solar concentrator enclosure (101), sunlight (108), the base side outer face (130), the loss reduction tube (131), a elevation tracking rotation axis frame (135), a elevation tracking rotation pin (136), a elevation tracking rotation pin center (137), a optical center line (138), a elevation tracking rotation collar (139), a azimuth tracking rotation axis frame (140), a azimuth tracking rotation pin (141), and a sunlight conversion device (142).

Rotationally positioned to between the six-sided solar concentrator enclosure (101) and the sunlight conversion device (142) is the optional loss reduction tube (131). Sunlight (108) concentrated by the six-sided solar concentrator enclosure (101) exits the loss reduction tube (131) at the sunlight aperture (133) into the sunlight conversion device (142). This sunlight may be used in any one or more ways to cook food, heat materials, fluids, etc.

Inside the sunlight conversion device (142) may be an optional inner side (143). The inner side (143) improves the heat absorption of any food, materials or fluids placed inside the sunlight conversion device (142). The inner side (143) may be reflective, or may be absorptive. Assuring the six-sided solar concentrator enclosure (101) receives the best sunlight (108) is important. To facilitate the best use, the solar concentrator system (100) incorporates two-axis tracking.

The elevation tracking rotation axis frame (135) and the azimuth tracking rotation axis frame (140) are components of the solar concentrator system (100) for aligning the solar concentrator system (100) with the sun (108).

The elevation tracking rotation axis frame (135) is used to adjust the elevation of the six-sided solar concentrator enclosure (101) of the solar concentrator system (100) as the sun travels along the sky.

The elevation tracking rotation axis frame (135) may be attached to the six-sided solar concentrator enclosure (101) at the base side outer face (130), or at other places.

The elevation tracking rotation axis frame (135) rotates with respect to the azimuth tracking rotation axis frame (140). To facilitate this rotation, attached to the elevation tracking rotation axis frame (135) is an elevation tracking rotation pin (136) and an elevation tracking rotation collar (139). The elevation tracking rotation pin (136) and the elevation tracking rotation collar (139) connect the elevation tracking rotation axis frame (135) to the azimuth tracking rotation axis frame (140).

In general, one of the elevation tracking rotation pin (136) or the elevation tracking rotation collar (139) will be fixed to the elevation tracking rotation axis frame (135), while the other will be fixed to the azimuth tracking rotation axis frame (140).

As such, the attachment of the elevation tracking rotation pin (136) to the elevation tracking rotation axis frame (135) may be fixed, or the elevation tracking rotation pin (136) may be rotationally attached to the elevation tracking rotation axis frame (135). The attachment of the elevation tracking rotation collar (139) to the elevation tracking rotation axis frame (135) may be fixed, or the elevation tracking rotation collar (139) may be rotationally attached to the elevation tracking rotation axis frame (135).

Conversely, the attachment of the elevation tracking rotation pin (136) to the azimuth tracking rotation axis frame (140) may be fixed, or the elevation tracking rotation pin (136) may be rotationally attached to the azimuth tracking rotation axis frame (140).

Likewise, the attachment of the elevation tracking rotation collar (139) to the azimuth tracking rotation axis frame (140) may be fixed, or the elevation tracking rotation collar (139) may be rotationally attached to the azimuth tracking rotation axis frame (140).

To assure optimum alignment of the solar concentrator system (100) with respect to the sun, the elevation tracking rotation pin (136) and the elevation tracking rotation collar (139) are aligned to the elevation tracking rotation pin center (137). The elevation tracking rotation pin center (137) is also along the optical center line (138), as is the loss reduction tube (131), as was previously discussed. Such design and alignment will ensure that the sunlight conversion device (142) does not move or rotate in the elevation direction as the sun moves. This is convenient for various uses of the sunlight conversion device (142).

The azimuth tracking rotation axis frame (140) is used to adjust the azimuth of the solar concentrator system (100) with its six-sided solar concentrator enclosure (101) and the sunlight conversion device (142) as the sun travels along the sky. The azimuth tracking rotation pin (141) allows the azimuth tracking rotation axis frame (140) to rotate the solar concentrator system (100) with its six-sided solar concentrator enclosure (101) and the sunlight conversion device (142) towards the sun.

Figure 9:
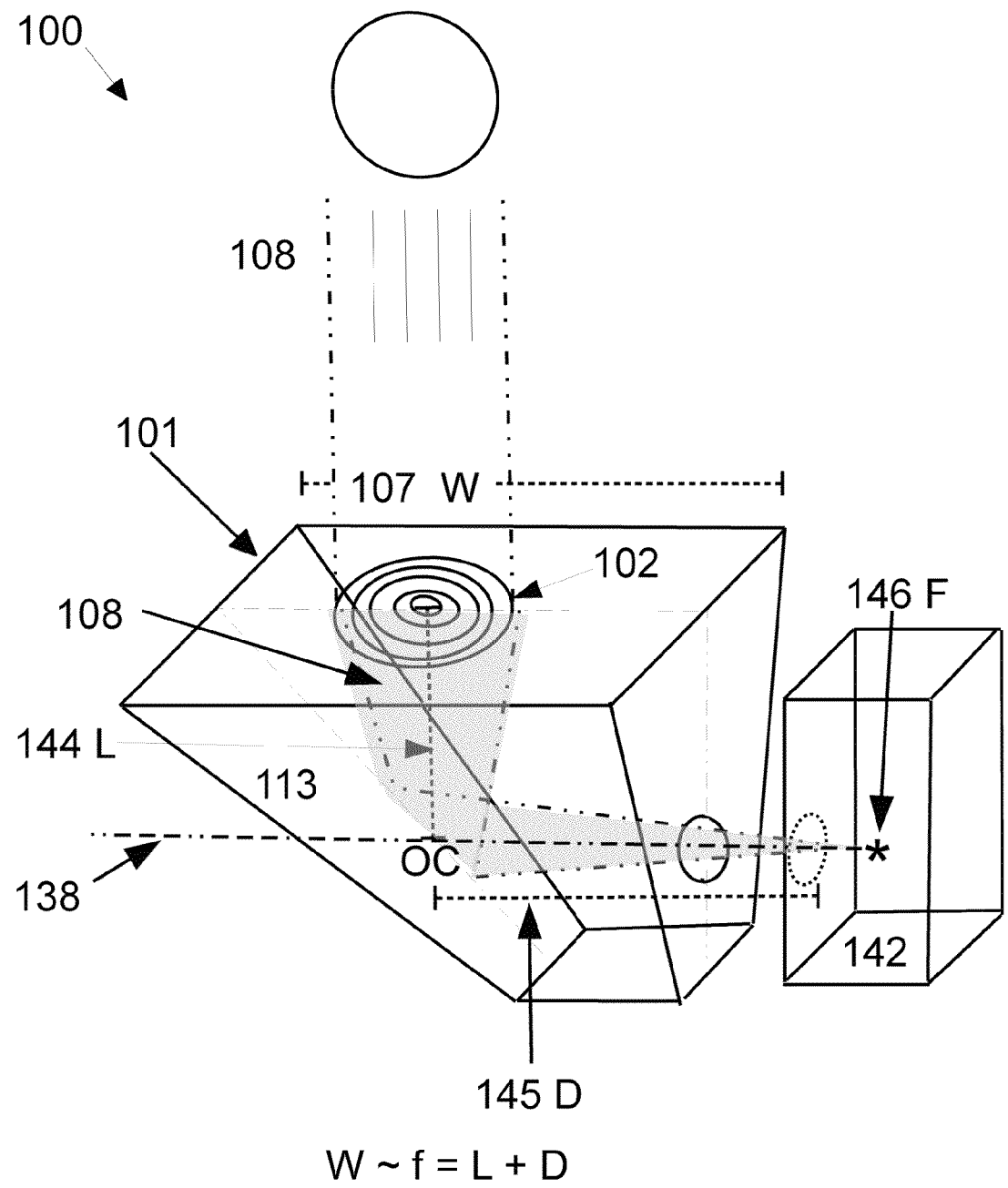
FIG. 9 is a partial drawing of the solar concentrator system (100) with its six-sided solar concentrator enclosure (101) and the exemplary sunlight conversion device (142) showing the optical properties of the solar concentrator system (100).

FIG. 9 is a partial drawing of the solar concentrator system (100) with its six-sided solar concentrator enclosure (101) and the exemplary sunlight conversion device (142) showing the optical properties of the solar concentrator system (100).

Of the features as shown in FIG. 9 are the solar concentrator system (100), the six-sided solar concentrator enclosure (101), the Fresnel lens (102) with an edge width W (107), the Fresnel lens optical center line (138), the Fresnel lens optical center point OC at the Fresnel lens optical center length L (144), an offset distance D (145), and the Fresnel lens focal point F (146) at the Fresnel lens focal length f=L+D.

As shown in FIG. 9, sunlight (108) enters the Fresnel lens (102) and is concentrated towards the flat reflector face (113) of the flat reflector side (109). On reaching the flat reflector face (113), the sunlight has reached the optical center point OC of the Fresnel lens (102), but not the focal point F (146). This is because the focal length f of the Fresnel lens is longer than the optical center length L (144). As the flat reflector face (113) is at a 45-degree angle to the Fresnel lens, the flat reflector face (113) reflects the sunlight towards convergence at the focal point F (146) of the Fresnel lens (102). By this design, the focal point (146) of the Fresnel lens (102) is a distance (L+D) from the Fresnel lens, which outside the solar concentrator enclosure (101). This is so the sunlight is most concentrated at the point of use at the sunlight conversion device (142).

In some embodiments, the solar concentrator system (100) may further comprise one or more of an elevation tracking drive (147) or an azimuth tracking drive (148).

In some embodiments, the sunlight conversion device of the solar concentrator system (100) is an oven, or a stove.

In some embodiments, the sunlight conversion device (142) of the solar concentrator system (100) may be a BBQ smoker, a water distiller, a food dehydrator, a circulating heat system, a clothes dryer, an absorption refrigerator, a thermal engine, or a photovoltaic panel.

In some embodiments, the solar concentrator system (100) may further comprise a cover over the six-sided solar concentrator enclosure (101) for adjusting the quantity of sunlight entering the six-sided solar concentrator enclosure (101), a sunlight blocking device for adjusting the quantity of sunlight entering the sunlight conversion device (142), a thermostatically controlled sunlight blocking device for adjusting the quantity of sunlight entering the sunlight conversion device (142), at least one reflective inner side (143) in the sunlight conversion device (142), or at least one absorptive inner side (143) in the sunlight conversion device (142). In some embodiments, the solar concentrator system (100) may further comprise a thermometer for measuring the sunlight conversion device temperature In some embodiments, a large thermal mass, such as water, bricks, or salts, may be placed inside the sunlight conversion device (142). When the sunlight conversion device (142) temperature is going up under concentrated sunlight, the thermal mass absorbs some of the heat and stores the thermal energy. The sunlight conversion device may be well insulated, so the thermal mass can cook foods at high temperatures in the sunlight conversion device (142) even if sunlight is not available due to cloud or sunset. This becomes a solar concentrator system with thermal storage.

In some embodiments, the sunlight conversion device (142) may have one or more transparent covers on the sunlight aperture (133) to limit the heat loss from the sunlight conversion device (142).

A thermal switch may be attached to the sunlight conversion device (142). When the temperature of thermal switch reaches a pre-set temperature, the thermal switch will open which will stop the solar tracking of the tracker or cause a window cover to block the sunlight. Then the temperature of the sunlight conversion device (142) will go down. If the temperature is lower than a pre-set temperature, the thermal switch will close again which will start the tracker and have more sunlight entering the sunlight conversion device (142)

to increase its temperature. Therefore, the sunlight conversion device (142) temperature is controlled and maintained.

Figure 10:
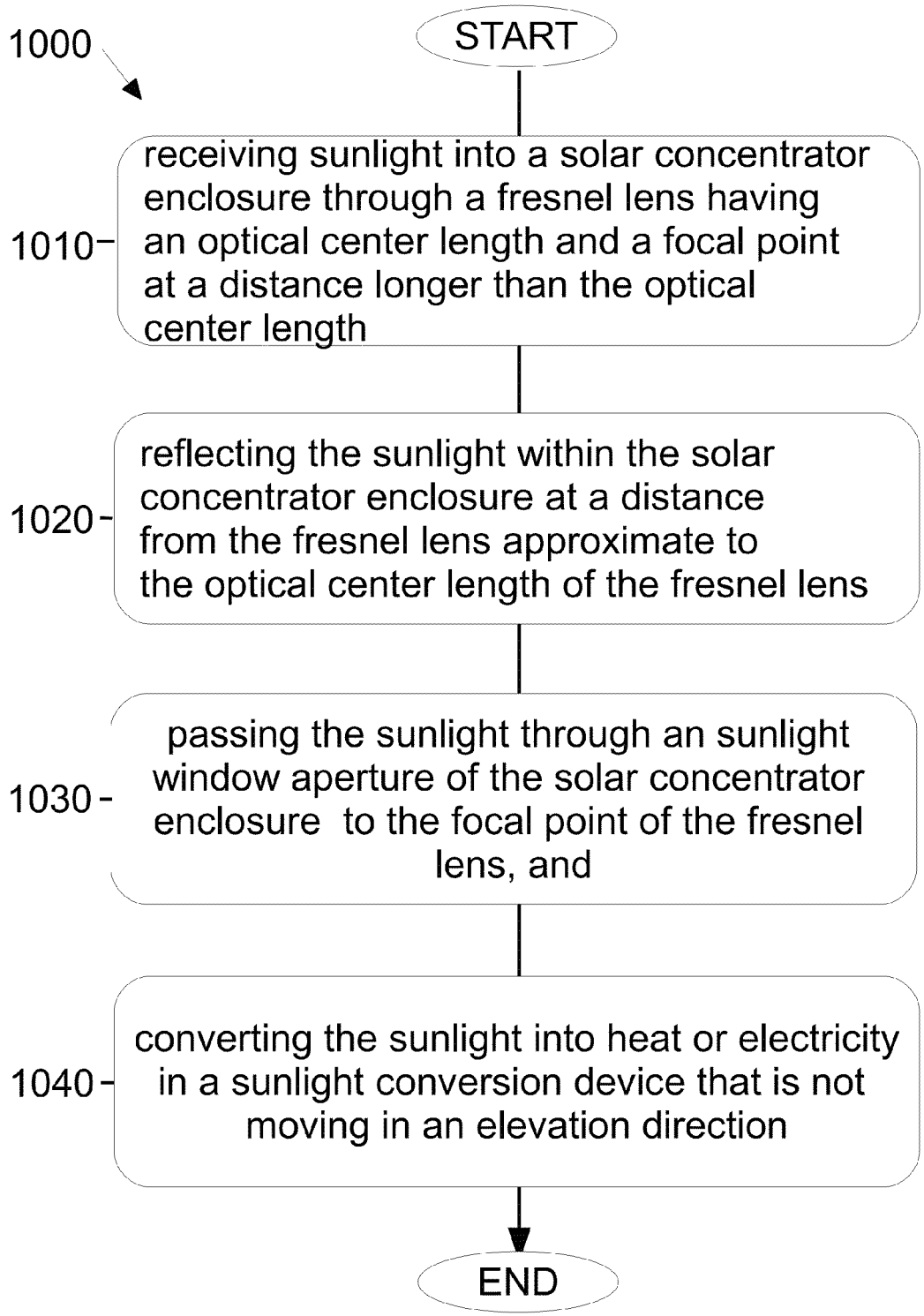
FIG. 10 is a drawing of a method for converting sunlight to heat or electricity.

FIG. 10 is a drawing of a method for converting sunlight to heat or electricity. As shown in FIG. 10, the method comprises: step 1010—receiving sunlight into a solar concentrator enclosure through a fresnel lens having an optical center length and a focal point at a distance longer than the optical center length; —step 1020—reflecting the sunlight within the solar concentrator enclosure at a distance from the fresnel lens approximate to the optical center length of the fresnel lens; —step 1030—passing the sunlight through an sunlight window aperture of the solar concentrator enclosure to the focal point of the fresnel lens, and step 1040—converting the sunlight into heat or electricity in a sunlight conversion device that is not moving in an elevation direction.

The foregoing descriptions of the preferred embodiments are examples. Variations of the above-described embodiments and methods are possible and contemplated for the present invention. The embodiments described herein are presented for illustration and are not intended to be exhaustive or limiting. Many variations and modifications are possible in light of the foregoing teaching.

What is claimed is:

1. A solar concentrator system comprising:
 a) a six-sided solar concentrator enclosure having a Fresnel lens with four edges, with at least two of the edges having an approximately equal width W, the Fresnel lens having an optical center point OC located at an optical center length L from the Fresnel lens along an optical center line, an offset distance D between the optical center point OC and a focal point F with a focal length f of the Fresnel lens equal to L+D, with the Fresnel lens oriented as to concentrate sunlight passing through the Fresnel lens into the six-sided solar concentrator enclosure;
 b) a flat reflector side in the shape of a trapezoid having a long parallel edge attached to the Fresnel lens, with a short parallel edge attached to a base side, with a first converging edge and a second converging edge equal in measurement and attached to the Fresnel lens at the long parallel edge and terminating at the short parallel edge, with the flat reflector side having a flat reflector face oriented at an angle ($\theta$) to receive concentrated but unfocused sunlight passing though the Fresnel lens and to reflect the sunlight towards a sunlight window side, with the short parallel edge smaller in measurement than the long parallel edge and equal in measurement to an adjacent edge of the base side;
 c) a sunlight window side facing the flat reflector side, the sunlight window side in the shape of a trapezoid having a long parallel edge attached to the Fresnel lens, with a short parallel edge attached to the base side, with a first converging edge and a second converging edge equal in measurement and attached to the Fresnel lens at the long parallel edge and terminating at the short parallel edge, with the sunlight window side oriented at an angle of approximately 90-degrees to the Fresnel lens, with the sunlight window side having a sunlight window with a center of a diameter, with the center of the diameter located along an optical center line such that reflected sunlight from the flat reflector side passes through the sunlight window to the focal point F of the Fresnel lens, with the short parallel edge smaller in measurement than the long parallel edge and equal in measurement to an adjacent edge of the base side;
 d) a first reflector side and a second reflector side in the shape of a trapezoid, the first reflector side and the second reflector side comprising opposite sides of the six-sided solar concentrator enclosure, with the first reflector side and the second reflector side connected between the flat reflector side and the sunlight window side, with the first reflector side having a long parallel edge attached to the Fresnel lens and a short parallel edge attached to the base side, with the second reflector side having a long parallel edge attached to the Fresnel lens and a short parallel edge attached to the base side, with the first reflector side having a first converging edge and a second converging edge attached to the Fresnel lens at the long parallel edge and terminating at the short parallel edge, with the second reflector side having a first converging edge and a second converging edge attached to the Fresnel lens at the long parallel edge and terminating at the short parallel edge, with the first reflector side having a flat reflector face oriented towards the second reflector side and the second reflector side having a flat reflector face oriented towards the first reflector side, and the short parallel edges of the first reflector side and the second reflector side equal in measurement to and attached to opposite edges of the base side;
 e) a base side with a first base edge attached to the short parallel edge of the flat reflector side, a second base edge attached to the short parallel edge of the sunlight window side, a third base edge attached to the short parallel edge of the first reflector side and a fourth base edge attached to the short parallel edge of the second reflector side, with a reflector inner face facing towards the Fresnel lens and a base outer face facing away from the six-sided solar concentrator enclosure;
 f) an elevation tracking rotation axis frame attached to the six-sided solar concentrator enclosure and having an elevation tracking rotation pin with a center that is aligned on the optical center line with the optical center point of the Fresnel lens, the center of the diameter of the sunlight window and with the focal point F of the Fresnel lens;
 g) an azimuth tracking rotation axis frame rotationally attached to the elevation tracking rotation axis frame, the azimuth tracking rotation axis frame having a azimuth tracking rotation pin located near the base outer face of the base side, such that the elevation tracking rotation axis frame and six-sided solar concentrator enclosure may rotate independent of the azimuth tracking rotation axis frame to track the sunlight; and
 h) a sunlight conversion device attached to the azimuth tracking rotation axis frame, and having a sunlight aperture for receiving concentrated sunlight from the six-sided solar concentrator enclosure at the focal point F of the fresnel lens.

2. The solar concentrator system of claim 1 wherein the width W of the at least two of the edges of the Fresnel lens is approximately equal to the focal length f of the Fresnel lens.

3. The solar concentrator system of claim 1 wherein the angle ($\theta$) of the flat reflector face of the flat reflector side is approximately 45-degrees to the Fresnel lens.

4. The solar concentrator system of claim 1 further comprising an elevation tracking drive.

5. The solar concentrator system of claim 1 further comprising an azimuth tracking drive.

6. The solar concentrator system of claim 1 further comprising an azimuth tracking drive and an elevation tracking drive.

7. The solar concentrator system of claim 1 further comprising a loss reduction tube rotationally positioned at the sunlight window for transmitting sunlight from the six-sided solar concentrator enclosure to a sunlight conversion device.

8. The solar concentrator system of claim 1 wherein the sunlight conversion device is a cooking device.

9. The solar concentrator system of claim 1 wherein the sunlight conversion device is a water distiller.

10. The solar concentrator system of claim 1 wherein the sunlight conversion device is a food dehydrator.

11. The solar concentrator system of claim 1 wherein the sunlight conversion device is a circulating heat system.

12. The solar concentrator system of claim 1 wherein the sunlight conversion device is a BBQ smoker.

13. The solar concentrator system of claim 1 wherein the sunlight conversion device is a clothes dryer.

14. The solar concentrator system of claim 1 wherein the sunlight conversion device is an absorption refrigerator.

15. The solar concentrator system of claim 1 wherein the sunlight conversion device is a thermal engine.

16. The solar concentrator system of claim 1 wherein the sunlight conversion device is a photovoltaic panel.

17. The solar concentrator system of claim 1 further comprising at least one reflective inner side in the sunlight conversion device.

18. The solar concentrator system of claim 1 further comprising at least one absorptive inner side in the sunlight conversion device.

19. The solar concentrator system of claim 1 further comprising a cover over the six-sided solar concentrator enclosure for adjusting a quantity of sunlight entering the six-sided solar concentrator enclosure.

20. The solar concentrator system of claim 1 further comprising a sunlight blocking device for adjusting a quantity of sunlight entering the sunlight conversion device.

21. The solar concentrator system of claim 1 further comprising a thermostatically controlled sunlight blocking device for adjusting the quantity of sunlight entering the sunlight conversion device.

22. The solar concentrator system of claim 1 further comprising a thermometer for measuring the sunlight conversion device temperature.

23. The solar concentrator system of claim 1 further comprising thermal switch in the sunlight conversion device.

24. The solar concentrator system of claim 1 further comprising a transparent cover on the sunlight aperture to limit the heat loss from the sunlight conversion device.

* * * * *